US006914292B2

(12) United States Patent
Specht et al.

(10) Patent No.: US 6,914,292 B2
(45) Date of Patent: Jul. 5, 2005

(54) FLOATING GATE FIELD-EFFECT TRANSISTOR

(75) Inventors: Michael Specht, München (DE); Martin Städele, Ottobrunn (DE); Wolfgang Rösner, Ottobrunn (DE); Franz Hofmann, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/302,615

(22) Filed: Nov. 21, 2002

(65) Prior Publication Data

US 2003/0122182 A1 Jul. 3, 2003

(30) Foreign Application Priority Data

Nov. 27, 2001 (DE) .......................................... 101 58 019

(51) Int. Cl.[7] ..................... H01L 29/788; H01L 21/8247
(52) U.S. Cl. ....................................... 257/321; 438/261
(58) Field of Search ............................... 257/316–324; 438/257–267

(56) References Cited

U.S. PATENT DOCUMENTS

| 4,630,086 | A | 12/1986 | Sato et al. | |
|---|---|---|---|---|
| 5,703,388 | A | 12/1997 | Wang et al. | |
| 5,789,297 | A | 8/1998 | Wang et al. | |
| 5,836,772 | A | * 11/1998 | Chang et al. | ................ 438/261 |
| 6,008,091 | A | * 12/1999 | Gregor et al. | .............. 438/261 |
| 6,121,654 | A | * 9/2000 | Likharev | ..................... 257/315 |
| 6,717,204 | B1 | * 4/2004 | Furuhata et al. | ............ 257/316 |
| 2001/0018254 | A1 | 8/2001 | Yamamoto | |
| 2002/0137288 | A1 | * 9/2002 | Nomoto et al. | ............. 438/261 |
| 2002/0190311 | A1 | * 12/2002 | Blomme et al. | ............ 257/321 |

FOREIGN PATENT DOCUMENTS

| DE | 196 30 984 A1 | 2/1998 |
|---|---|---|
| DE | 196 38 969 A1 | 4/1998 |
| DE | 19823768 | 12/1999 |
| DE | 199 03 598 A1 | 8/2000 |
| EP | 1124262 | 8/2001 |
| WO | WO 99/19913 | 4/1999 |
| WO | WO 00/45441 | 8/2000 |
| WO | WO 00/75997 | 12/2000 |

* cited by examiner

*Primary Examiner*—Richard A. Booth
(74) *Attorney, Agent, or Firm*—Altera Law Group, LLC; Jeffrey R. Stone

(57) ABSTRACT

A floating gate field-effect transistor (400), which is preferably used as a memory cell, has, above or below a floating gate region (407), an electrically insulating layer sequence (408) having a lower layer (409) having a first relative permittivity, having a middle layer (410) having a second relative permittivity, and having an upper layer (411) having a third relative permittivity, the second relative permittivity being greater than the first relative permittivity and greater than the third relative permittivity.

7 Claims, 7 Drawing Sheets

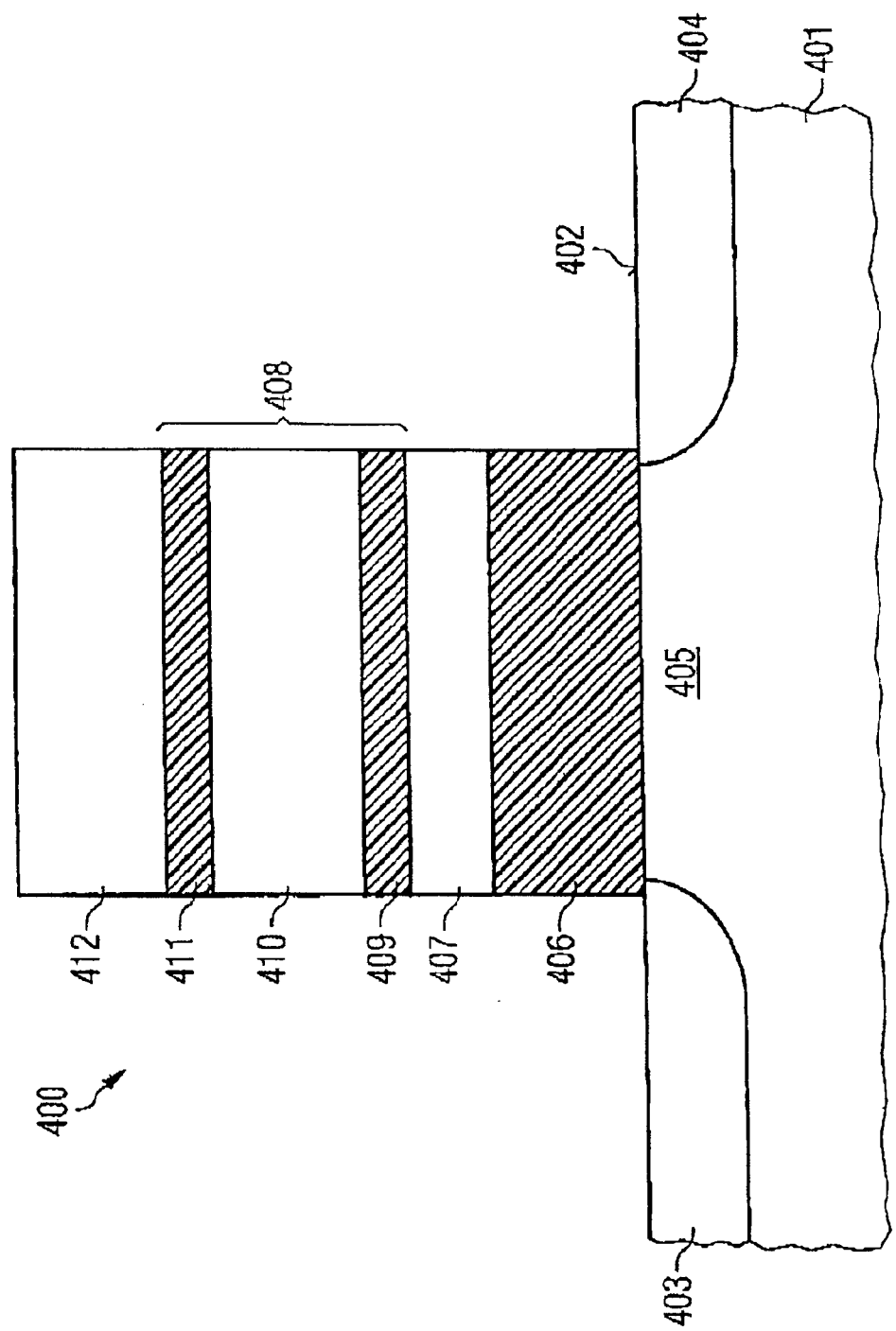

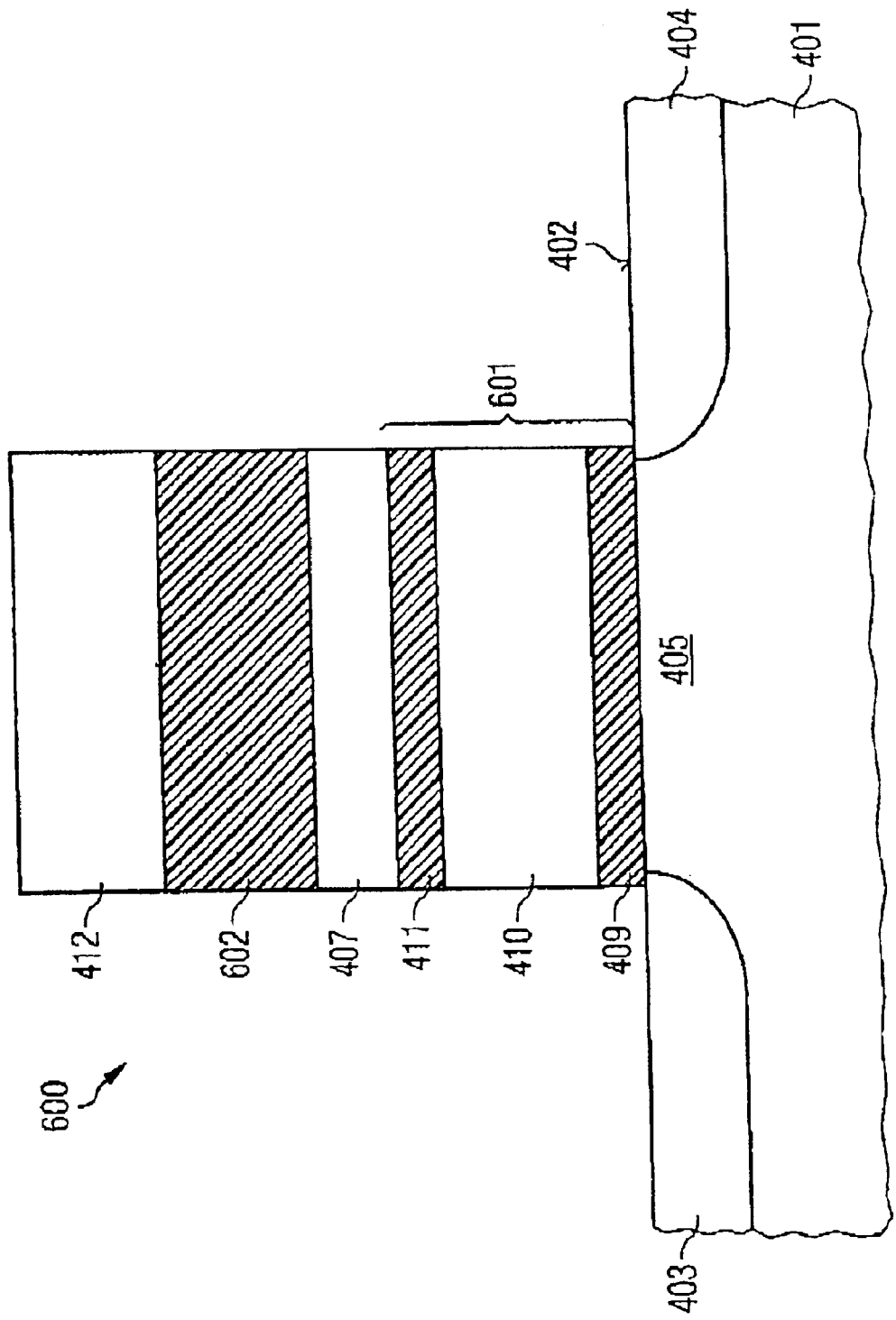

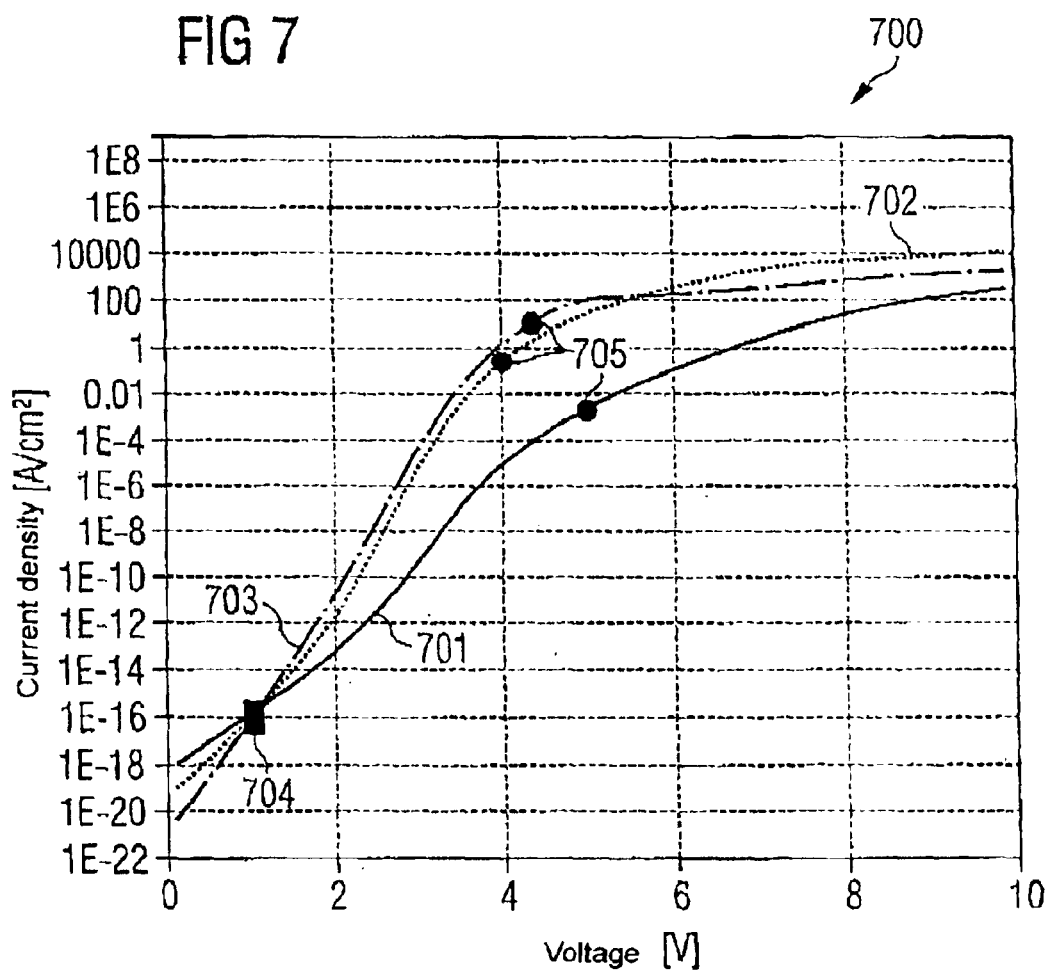

FLOATING GATE FIELD-EFFECT TRANSISTOR

The invention relates to a floating gate field-effect transistor.

In view of the rapid ongoing development in computer technology, there is a need for memory media which provide ever larger amounts of memory on ever smaller arrangements with ever shorter writing, reading and erasing times. Usually, large amounts of data are stored in an arrangement of memory cells. An overview of memory cells in accordance with the prior art is given by [1], for example.

[2] discloses a power component which is called a smart power component, serves for reliably switching inductive loads and has a current detecting element for detecting the current through the inductive load.

On the one hand, so-called dynamic memory cells (DRAM=dynamic random access memory) and, on the other hand, nonvolatile memory cells are known as powerful memory cells.

A dynamic memory cell has a selection transistor and a storage capacitor. In this case, the selection transistor serves for selecting the associated storage capacitor within a memory arrangement on a chip. Depending on the charge state of the storage capacitor, i.e. either electrically charged or uncharged, the storage capacitor has either a storage state with a logic value "0" or a storage state with a logic value "1". Since the capacitor charge is reduced in a time of approximately 1 second on account of recombination and leakage currents in known memory cells, the charge has to be repeatedly resupplied. The information has to be written in again after a read operation, too. This resupply of charge is effected automatically with the aid of an integrated circuit on the chip. It is this special feature that has given the memory the name dynamic memory. Dynamic memory cells advantageously have short writing and reading times of the order of magnitude of ten nanoseconds. What is disadvantageous, however, is that dynamic memory cells have to be permanently supplied with energy. This results in a high waste heat and hence heating of the memory arrangement. Furthermore, a dynamic memory cell has a high energy demand, which makes dynamic memory cells cost-intensive to operate. Moreover, dynamic memory cells have the disadvantage that the stored information is lost upon disconnection from the voltage supply.

A nonvolatile memory (NVM=non volatile memory) is distinguished by the fact that the information stored in the memory cell is preserved, even after the supply voltage has been switched off, for a long retention time of typically at least ten years. The nonvolatile semiconductor memory used the most often is the EEPROM (EEPROM=electrically erasable and programmable read-only memory). An EEPROM provides the operator with frequently repeatable reading, electrical erasure and programming.

An important example of an EEPROM is a field-effect transistor with a so-called floating gate, which transistor is designed as a memory cell. In the case of this memory cell, the electrical charge is stored in a floating gate, i.e. a layer of electrically conductive material which is electrically decoupled from its surroundings. The charge reloading of the floating gate is effected by means of tunneling electrons which tunnel through an electrically insulating oxide layer between the electrode regions of the field-effect transistor and the floating gate.

In a memory cell with a floating gate, the storage capacitor of the DRAM is replaced by the field-effect transistor of the memory cell itself. During programming, a positive electrical voltage of typically +10 V in the case of a CHE cell (CHE=channel hot electron) and between +15 V and +20 V in the case of an FN cell (FN=Fowler-Nordheim) is applied to the word line of a selected memory cell. Since the selected floating gate field-effect transistor is conductive under these potential conditions, an $n^+$-doped source/drain region or the channel region between the two source/drain regions below an oxide layer is brought to a sufficiently high electrical potential. As a result, the electric field strength in the oxide layer is brought close to the breakdown field strength of approximately $10^7$ V/cm. Consequently, electrons tunnel between the floating gate and the underlying source/drain region or channel region. As a result, a non-compensated electrical charge remains in the floating gate and stays there for a long retention time of typically ten years. This lasts even when electrical voltages are no longer present on the floating gate field-effect transistor.

The EEPROM is a particularly space-saving nonvolatile memory cell, two embodiments of which are briefly described below. In the case of the CHE cell, so-called "hot", i.e. sufficiently high-energy, electrons tunnel in the vicinity of the drain region through the oxide layer into the floating gate. By contrast, in the case of the FN cell, the electrons tunnel into the floating gate on account of a high electric field in the oxide layer. The term Fowler-Nordheim tunneling denotes the process in which electrons tunnel through a tunnel layer in the presence of a sufficiently high electric field.

The writing and erasing times of existing EEPROM memories lie in the range between approximately one millisecond and approximately ten microseconds. The writing and erasing times of EEPROM memories are thus significantly slower than the writing and erasing times of DRAM memories. The reason for this is connected with the tunnel barrier between the floating gate and the conducting channel, since a tunnel barrier produced from silicon dioxide, for example, must have a minimum thickness of approximately ten nanometers in order to ensure a memory cell retention time of ten years. This requires high writing and erasing voltages of typically 10 V, in some instances up to 20 V. Such high electrical voltages for writing and erasing are disadvantageous since elements in integrated circuits can be adversely affected and even destroyed by excessively high electrical voltages.

Three concepts known from the literature are described below, the subject matter of which concepts is to provide memory cells having short writing and erasing times, the memory cells having retention times of the order of magnitude of ten years.

The principle of the so-called PLED memory cell 100 (PLED=planar localized electron device), which is disclosed in [3], is described below with reference to FIG. 1.

The PLED memory cell 100 illustrated in FIG. 1 has a substrate 101, a source region 102 in a first surface region of the substrate 101 and a drain region 103 in a second surface region of the substrate 101. The substrate 101 with the source and drain regions 102, 103 introduced therein is isolated from a charge storage region 105 by means of an electrically insulating region 104, which fulfils the function of a gate oxide layer in the region between the source region 102 and the drain region 103. Arranged above the charge storage region 105 are a plurality of double layers, each of the double layers alternatingly having a tunnel layer 106 and a semiconducting region 107 made of intrinsic silicon. The PLED memory cell 100 illustrated has four double layers each comprising a tunnel layer 106 and a semiconducting region 107. An electrode 108 is provided above the arrangement of double layers. At the side edges of the double layers, the latter are isolated from a lateral gate electrode 109 by means of a thin oxide layer which is formed as part of the electrically insulating region 104.

The PLED memory cell 100 can be used as a data memory. This makes use of the effect that electrical charge carriers that may have been introduced into the charge storage region 105 characteristically influence the electrical conductivity of the channel between the source region 102 and the drain region 103. If electrical charge carriers have been introduced in the charge storage region 105, then the channel between the source region 102 and the drain region 103 has a first electrical conductivity. A voltage applied between the source region 102 and the drain region 103 then leads to a current flow of a first current intensity between the source region 102 and the drain region 103. By contrast, if the charge storage region 105 is free of electrical charge carriers, then the channel between the source region 102 and the drain region 103 has a second electrical conductivity, which differs significantly from the first electrical conductivity. Moreover, an electrical voltage applied between the source region 102 and the drain region 103 effects an electrical current flow of a second current intensity, the second current intensity differing significantly from the first current intensity.

If an electrical voltage is not applied to the lateral gate electrode 109, then the double layers comprising the tunnel layers 106 and the semiconducting regions 107 are electrically insulating, so that charge carriers that may have been introduced in the charge storage region 105 are permanently stored there. By the application of a suitable electrical voltage to the lateral gate electrode 109, an electrically conductive region is in each case formed at the left-hand and right-hand edges of the tunnel layers 106. The double layers comprising the tunnel layers 106 and the semiconducting regions 107 are readily electrically conductive in this state. If a further electrical voltage is applied to the electrode 108 in this state, then charge carriers can flow from the electrode 108 to the charge storage region 105, or vice versa. After the electrical voltage applied to the lateral gate electrode 109 has been switched off, the double layer comprising the tunnel layer 106 and the semiconducting regions 107 becomes electrically insulating again, so that charge carriers that may have been stored in the charge storage region 105 permanently remain there. The fast writing and erasing is thus achieved in accordance with the PLED memory cell 100 by the side regions of a multiple tunnel barrier being made electrically conductive by the lateral application of an additional electrical voltage.

However, both the production and the operation of a PLED memory cell are complex since, on the one hand, the PLED memory cell has to be realized with four electrodes and, on the other hand, the four electrodes of the PLED memory cell have to be electrically coupled to corresponding interconnects in the memory arrangement. In this case, however, the four electrodes cannot be produced using simple planar technology. Consequently, PLED memory cells are complex and expensive.

The concept of a resonant tunnel diode 200, which is disclosed in [4] and can be used in extended form as a tunnel dielectric, is described below with reference to FIG. 2a and FIG. 2b.

The resonant tunnel diode 200 illustrated in FIG. 2a has an $n^+$-doped silicon substrate 201, a first tunnel barrier 202, a potential well layer 203, a second tunnel barrier 204, an electrically insulating layer 205 and an electrode 206. The electrode 206 is a structure made of aluminum and gold in accordance with the resonant tunnel diode 200 illustrated in FIG. 2a. The first tunnel barrier 202 is produced from calcium difluoride ($CaF_2$), the potential well layer 203 is produced from cadmium difluoride ($CdF_2$), and the second tunnel barrier 204 is again produced from calcium difluoride ($CaF_2$).

FIG. 2b illustrates the potential conditions (the electrical potential V is plotted horizontally) along the resonant tunnel diode 200 (the latter's structure is plotted vertically).

In particular, the potential well layer 203 has two energy levels 203a, 203b, which are provided in such a way that an electrical current flow through the potential well layer 203 is not possible in the absence of an electrical voltage between the $n^+$-doped silicon substrate 201 and the electrode 206. If, by contrast, as illustrated in FIG. 2b, a suitable electrical voltage is applied between the $n^+$-doped silicon substrate 201 and the electrode 206, then the first energy level 203a of the potential well layer 203 is at such an electrical potential that an electrical current flow from the $n^+$-doped silicon substrate 201 through the potential well layer 203 right into the electrode 206 is enabled. This is illustrated by means of an arrow 207 in FIG. 2b.

Although resonant tunnel diodes enables to replace the silicon dioxide ($SiO_2$) used as tunnel dielectric, they have the disadvantage that no controllable power components are integrated into them.

[5] discloses the concept of the so-called "crested barrier". In accordance with this concept, a serial arrangement of typically three tunnel barriers with different energetic heights of the potential barriers is used in place of the oxide layer between conducting channel and floating gate of a floating gate field-effect transistor. In the case of the conventional EEPROM memories described above, the oxide layer between conducting channel and floating gate is usually a silicon dioxide layer having a thickness of approximately ten nanometers and having a homogeneous structure. Theoretical considerations show that a barrier of the same thickness which does not have a rectangular, but rather an at least approximately stepped electrical potential profile with the highest potential barrier in the center enables an accelerated writing and erasing with no change to the holding time. This is due to the fact that with an approximately stepped electrical potential profile, the voltage required for writing and erasing can be significantly lower than in the case of a rectangular electrical potential profile.

In this case, the basic idea of the "crested barrier" concept consists in comparing the ratio of the tunneling current intensity through a tunnel layer with the writing or erasing voltage applied to the tunneling current intensity with half the writing or erasing voltage applied for a tunnel barrier with a rectangular potential profile and for a tunnel barrier with a stepped potential profile with the highest potential barrier in the center. It is found that this tunneling current ratio is considerably larger for a stepped potential barrier with the highest potential barrier in the center than for a rectangular barrier. Said tunneling current ratio is a measure of the ratio between the retention time and the erasing time or for the ratio between the retention time and the programming time of a memory cell based on the "crested barrier" concept.

According to [5], a stepped potential profile with the highest potential barrier in the center can be approximated by means of three thin layers, the middle layer having a higher potential barrier than the two edge layers. A rectangular potential profile 301 of a tunnel barrier 300 is illustrated in the ground state 302 in FIG. 3a and in the strained state 303 in FIG. 3b and a stepped potential profile 304 of a tunnel barrier is illustrated in the ground state 305 in FIG. 3c and in the strained state 306 in FIG. 3d. The tunnel barrier 300 has a thickness D and a potential height U relative to the Fermi level $E_F$ of the tunnel barrier 300. In the case of a stepped potential profile 304 which is realized by means of three thin layers, the middle layer has a thickness d and a high potential barrier U' relative to the Fermi level $E_F$, while the two outer layers each have a thickness d' and a low potential barrier U" relative to the Fermi level $E_F$. In this case, the thickness d of the middle layer is usually more than 3 nm in order to ensure a reliable insulation effect of the tunnel barrier.

As long as the potential profile of the tunnel barrier 300 is in the ground state 302 or 305, no charge carrier exchange takes place between the two layers which adjoin the tunnel barrier 300 on the left and right in the figures, since the tunneling current or the tunneling probability is too low. If the potential profile of the tunnel barrier 300 is biased by means of an external potential difference V present at the layer situated to the right of the tunnel barrier 300, the potential profile is shifted. In this case, the Fermi level $E_F$ of the layer adjoining the tunnel barrier 300 on the right is lowered by the energy difference eV to a strained Fermi level $E_F'$. This enables electrons to tunnel through the tunnel barrier 300. This consequently results in an exchange of charge carriers in the form of an electric current j between the layers adjoining the tunnel barrier 300. This current j flows owing to the energy difference eV from the side of the tunnel barrier 300 with the higher Fermi level $E_F$ to the side of the tunnel barrier 300 with the lower, strained Fermi level $E_F'$.

It is found in this case that the current density of Fowler-Nordheim tunneling is significantly more sensitively dependent on an applied voltage for the described stepped potential profile with the highest potential barrier in the center than for a rectangular potential profile.

However, the stepped potential profile with the highest potential barrier in the center from the "crested barrier" concept has the disadvantage that when a potential difference is present between the two ends of the tunnel barrier layer, the latter is strained in such a way that a charge carrier sink 307 is formed at the middle layer of the tunnel barrier. Charge carriers are accumulated in the charge carrier sink 307 since they cannot tunnel through the middle layer owing to the thickness thereof. However, this charge carrier accumulation in the charge carrier sink 307 can lead to an undesirable change in the electronic properties of a "crested barrier" field-effect transistor. In particular, the "crested barrier" concept is suitable only to a limited extent for low voltages of less than +10 V.

Consequently, the invention is based on the problem of providing a floating gate field-effect transistor as nonvolatile data memory with shortened writing and erasing times compared with the prior art in conjunction with retention times which are essentially at least maintained with the same length.

The problem is solved by means of a floating gate field-effect transistor having the features in accordance with the independent patent claim.

A floating gate field-effect transistor has a source region, a drain region and a channel region, a first electrical insulation layer arranged above the channel region, a floating gate region arranged above the first electrical insulation layer, a second electrical insulation layer arranged above the floating gate region, and a gate region arranged above the second electrical insulation layer. The first electrical insulation layer or the second electrical insulation layer has an electrically insulating layer sequence comprising three layers. This electrically insulating layer sequence has a lower layer made of a material having a first relative permittivity, a middle layer made of a material having a second relative permittivity and an upper layer made of a material having a third relative permittivity. In this case, the second relative permittivity is greater than the first relative permittivity and greater than the third relative permittivity.

Clearly, the electrically insulating layer sequence of the floating gate field-effect transistor can thus be regarded as a triple tunnel barrier.

One advantage of the invention can be seen in the fact that the floating gate field-effect transistor constitutes a memory element which has a special electrically insulating layer sequence as tunnel barrier with respect to the floating gate region. In terms of material technology, the electrically insulating layer sequence is provided in such a way that a stepped potential profile clearly forms in the tunnel barrier, the middle layer having a lower potential barrier than the lower layer and, at the same time, than the upper layer. This stepped potential profile can clearly also be regarded as a potential well. This is a direct consequence of the suitable material selection and thus of the respective relative permittivity for the individual layers of the electrically insulating layer sequence.

When an external potential difference V is applied to the floating gate, the stepped potential profile of the electrically insulating layer sequence is strained by an energy eV. In this case, the lower potential barrier of the middle layer is lowered below the Fermi level $E_F$. If the Fermi level $E_F$, which, by way of example, adjoins the upper layer of the electrically insulating layer sequence, is lowered by the energy eV to the strained Fermi level $E_F'$, the potential barrier of the upper layer is also lowered below the Fermi level $E_F$.

Consequently, only the potential barrier of the lower layer remains above the Fermi level $E_F$. In order to achieve a current flow from the Fermi level $E_F$ below the electrically insulating layer sequence into the strained Fermi level $E_F'$ above the electrically insulating layer sequence, electrons have to tunnel from the Fermi level $E_F$ merely through the potential barrier of the lower layer. What is thus achieved is that, in the strained state, the thickness of the electrically insulating layer sequence that is effectively to be tunneled through is less than the thickness of a continuously homogeneous electrical insulation layer with a rectangular, i.e. linear, potential profile. The consequence of this is that with the length of the retention time being maintained, in the case of the electrically insulating layer sequence, the current density can be increased and the writing and erasing times can thus be shortened.

The effectively active thickness (EOT=equivalent oxide thickness) of the electrically insulating layer sequence in the voltage-free state can be calculated from the physical thickness and the relative permittivities of the materials used in the electrically insulating layer sequence and is used for comparison with the thickness of a continuously homogeneous electrical insulation layer with a linear potential profile. By way of example, an effectively active width $d_{EOT}$ of 1.9 nm is calculated for a layer made of silicon nitride ($Si_3N_4$) having a physical thickness d of 3.8 nm, a relative permittivity $\epsilon_1$ of 7.8 for silicon nitride ($Si_3N_4$) and a relative permittivity $\epsilon_2$ of 4 for silicon oxide ($SiO_2$) in accordance with $d_{EOT}=\epsilon_2/\epsilon_1 \cdot d$. Consequently, an electrically insulating layer sequence comprising a layer of silicon dioxide ($SiO_2$) having a thickness of 1 nm, a layer of silicon nitride ($Si_3N_4$) having a thickness of 3.8 nm and a layer of silicon dioxide (SiO$_2$) having a thickness of 1 nm has an effectively active total thickness of 3.9 nm.

A further advantage of the floating gate field-effect transistor is that the stepped potential profile with a lower potential barrier in the center prevents the formation of a charge carrier sink such as, for example, in accordance with the "crested barrier" concept. On account of the material selection specified, both the lower layer and the upper layer of the electrically insulating layer sequence can be chosen to be sufficiently thin such that, in the strained state, charge carriers can tunnel largely unimpeded through the lower layer and the upper layer. Consequently, no charge carriers which tunnel through the electrically insulating layer sequence in the strained state are accumulated. This furthermore has the consequence that the electronic properties of the floating gate field-effect transistor remain uninfluenced.

Clearly, the floating gate field-effect transistor is thus set up in such a way that charge carrier accumulation does not take place when an electric field is present in the electrically insulating layer sequence.

The lower layer and the upper layer of the floating gate field-effect transistor preferably have a potential barrier that is between 0.5 eV and 1.5 eV higher than that of the middle layer.

Preferably, in the case of the floating gate field-effect transistor, the first relative permittivity and the third relative permittivity each have a value in the range between 1 and 10, and the second relative permittivity preferably has a value in the range between 10 and 25.

In a preferred embodiment of the floating gate field-effect transistor, in the electrically insulating layer sequence, the lower layer and the upper layer are produced from the same material.

The lower layer and the upper layer of the electrically insulating layer sequence of the floating gate field-effect transistor preferably each have a thickness in the range from 0.5 nm to 2 nm. The middle layer of the electrically insulating layer sequence of the floating gate field-effect transistor preferably has a thickness in the range from 5 nm to 10 nm. As a result, the required voltage for programming or erasing the floating gate region of the floating gate field-effect transistor is reduced to less than 8 V. The required writing time for programming or erasing the floating gate region is likewise reduced from a few microseconds to less than 10 nanoseconds. For low voltages, in particular, the concept according to the invention is thus more advantageous by comparison with the "crested barrier" concept.

In a preferred embodiment of the floating gate field-effect transistor, the lower layer and the upper layer of the electrically insulating layer sequence each have silicon dioxide (SiO$_2$) and a thickness of 1 nm, while the middle layer of the electrically insulating layer sequence has zirconium oxide (ZrO$_2$) and a thickness of 6 nm. In this case, layers having a thickness of 1 nm can be produced for example by means of so-called atomic layer deposition (ALD=atomic layer deposition). Instead of silicon dioxide (SiO$_2$) for the upper layer and the lower layer, it is also possible to use for example aluminum oxide (Al$_2$O$_3$), lanthanum oxide (La$_2$O$_3$), yttrium oxide (Y$_2$O$_3$) or silicon nitride (Si$_3$N$_4$). Instead of zirconium oxide (ZrO$_2$) for the middle layer, it is also possible to use for example hafnium oxide (HfO$_2$), silicon nitride (Si$_3$N$_4$) or a so-called aluminate. The term aluminate denotes a mixed structure comprising aluminum oxide (Al$_2$O$_3$) and another oxide of a material having a high relative permittivity.

Exemplary embodiments of the invention are illustrated in the figures and are explained in more detail below. In this case, identical reference symbols designate identical components. In the figures:

FIG. 4 shows a diagrammatic cross section through a floating gate field-effect transistor in accordance with a first exemplary embodiment of the invention;

FIG. 6 shows a diagrammatic cross section through a floating gate field-effect transistor in accordance with a second exemplary embodiment of the invention; and FIG. 7 shows a diagram with current density/voltage characteristic curves for three different types of electrical insulation layers for a floating gate field-effect transistor.

FIG. 4 shows a diagrammatic cross section through a floating gate field-effect transistor 400 in accordance with a first exemplary embodiment of the invention.

Figure 1:
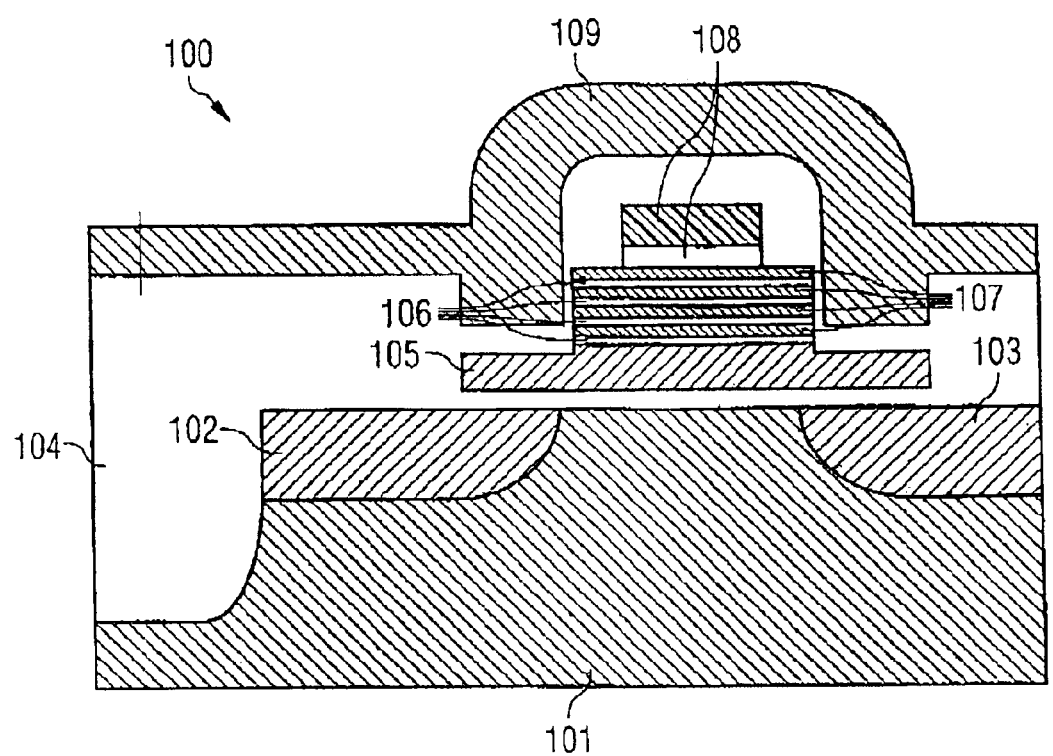
FIG. 1 shows the principle of a PLED memory cell in accordance with the prior art.
Figure 2A:
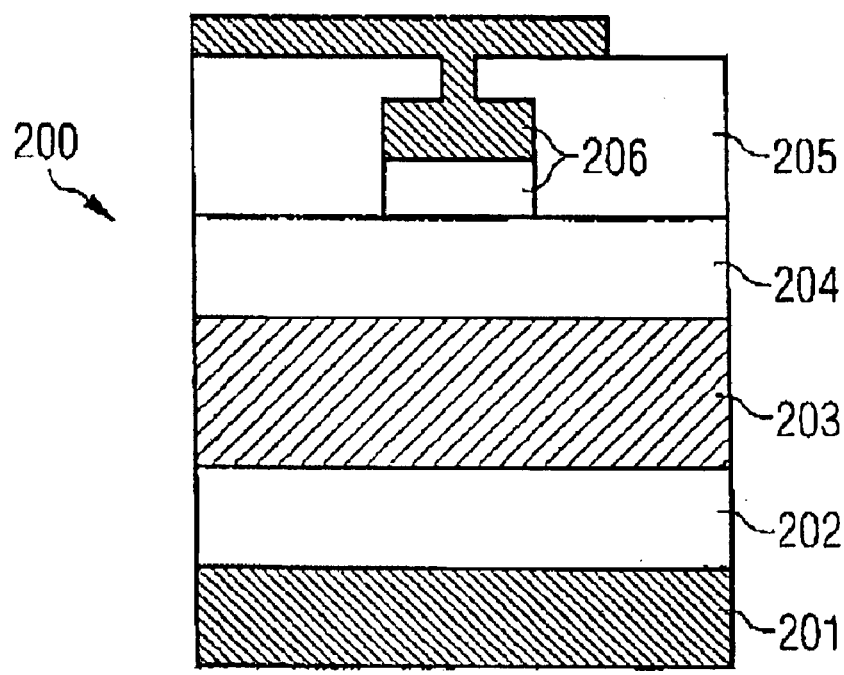
FIG. 2a shows a resonant tunnel diode in accordance with the prior art.
Figure 2B:
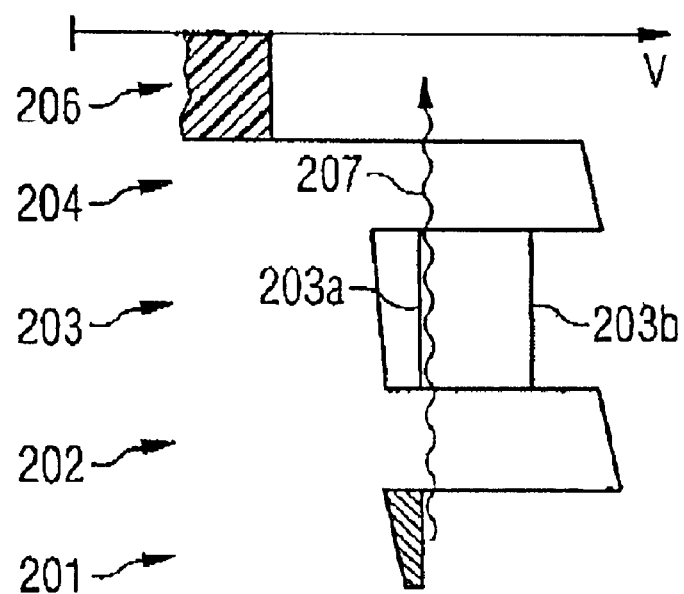
FIG. 2b shows the potential conditions along the resonant tunnel diode in accordance with the prior art.
Figure 3A:
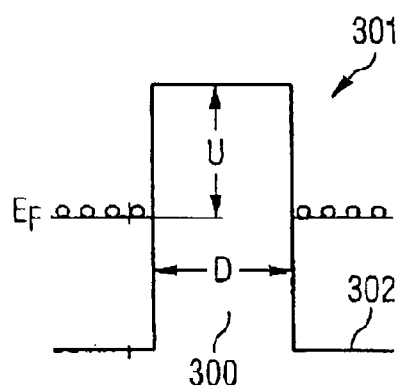
FIG. 3a shows a rectangular potential profile in the ground state for an insulation layer between floating gate and transistor electrodes in accordance with the prior art.
Figure 3B:
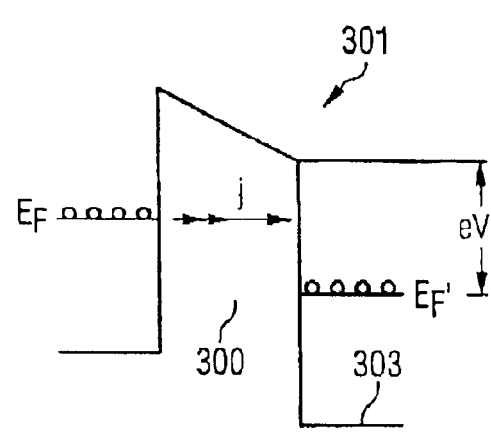
FIG. 3b shows a rectangular potential profile in the strained state for the insulation layer between floating gate and transistor electrodes in accordance with the prior art.
Figure 3C:
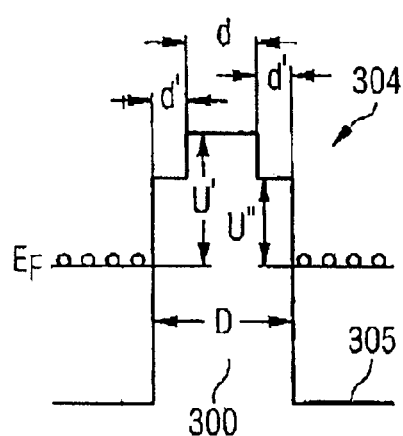
FIG. 3c shows a stepped potential profile with the highest potential barrier in the center in the ground state for the insulation layer between floating gate and transistor electrodes in accordance with the prior art.
Figure 3D:
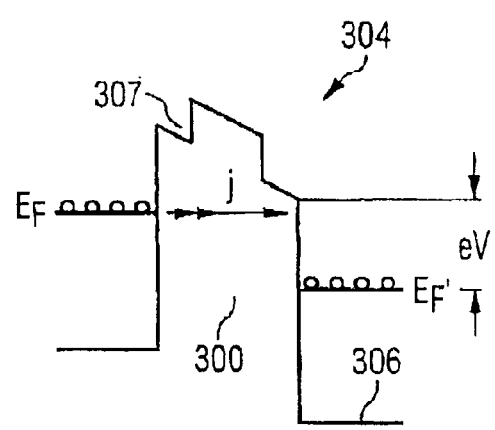
FIG. 3d shows a stepped potential profile with the highest potential barrier in the center in the strained state for the insulation layer between floating gate and transistor electrodes in accordance with the prior art.

The floating gate field-effect transistor 400 in accordance with this exemplary embodiment is based on a semiconductor substrate 401 made of silicon. In the semiconductor substrate 401, there are arranged at a substrate surface 402 an n$^+$-doped source region 403 and an n$^+$-doped drain region 404, which are spatially separated from one another by a channel region 405 arranged between them. A first electrical insulation layer 406 is applied on the substrate surface 402 above the channel region 405. In accordance with this exemplary embodiment, the first electrical insulation layer 406 has silicon dioxide (SiO$_2$) with a thickness of 10 nm.

Arranged above the first electrical insulation layer 406 is a floating gate region 407, which can have any desired electrically conductive material. Arranged above that is a second electrical insulation layer 408, which is composed of the following three partial layers: arranged above the floating gate region 407 are firstly a lower layer 409, above that a middle layer 410 and then an upper layer 411. In accordance with this exemplary embodiment, the lower layer 409 and the upper layer 411 each have silicon dioxide (SiO$_2$) having a thickness of 1 nm in each case. In accordance with this exemplary embodiment, these two layers are deposited by means of atomic layer deposition (ALD). In accordance with this exemplary embodiment, the middle layer 410 has zirconium oxide (ZrO$_2$) having a thickness of 6 nm.

Consequently, the second electrical insulation layer 408 has a physical total thickness d of 8 nm. The value of the relative permittivity of zirconium oxide ($ZrO_2$) is defined at 25. An effectively active total thickness of about 3.0 nm results from this owing to $d_{EOT}=\epsilon_2/\epsilon_1 \cdot d$ for the second electrical insulation layer 408.

Finally, a gate electrode 412 is applied above the second electrical insulation layer 408, which gate electrode is composed of polysilicon in accordance with this exemplary embodiment. In accordance with this exemplary embodiment, storage in or erasure of the floating gate region 407 is effected from the gate electrode 412 through the second electrical insulation layer 408. On account of the smaller thickness of the second electrical insulation layer 408 in comparison with a homogeneous insulation layer made of silicon dioxide ($SiO_2$) with the same insulation effect, the required programming or erasing voltage can be reduced to less than 8 V and the required writing time to less than 10 ns.

Figure 5A:
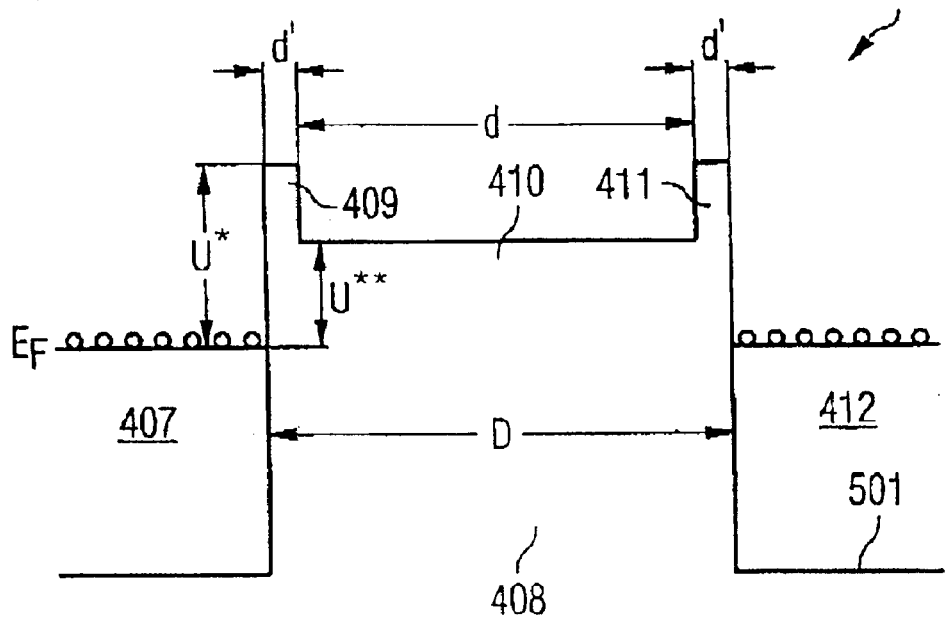
FIG. 5a shows a stepped potential profile with a lower potential barrier in the center in the ground state for the second electrical insulation layer of the floating gate field-effect transistor in accordance with FIG. 4.

FIG. 5a illustrates a stepped potential profile 500 with a lower potential barrier in the center in the ground state 501 for the second electrical insulation layer 408 of the floating gate field-effect transistor 400 in accordance with FIG. 4.

The Fermi level $E_F$ is depicted in each case for the floating gate region 407 and the gate electrode 412 of the floating gate field-effect transistor 400. As already explained in the description with regard to FIG. 4, the second electrical insulation layer 408 has a total thickness D of 8 nm and is composed of the lower layer 409, the middle layer 410 and the upper layer 411. The lower layer 409 and the upper layer 411 of the second electrical insulation layer 408 each have a thickness d' of 1 nm and have a high potential barrier U* with respect to the Fermi level $E_F$ of the floating gate region 407 and the gate electrode 412, respectively. The middle layer 410 has a thickness d of 6 nm and has a low potential barrier U**, which is between 0.5 eV and 1.5 eV lower than the high potential barrier U*, with respect to the Fermi level $E_F$ of the floating gate region 407 and the gate electrode 412, respectively.

Figure 5B:
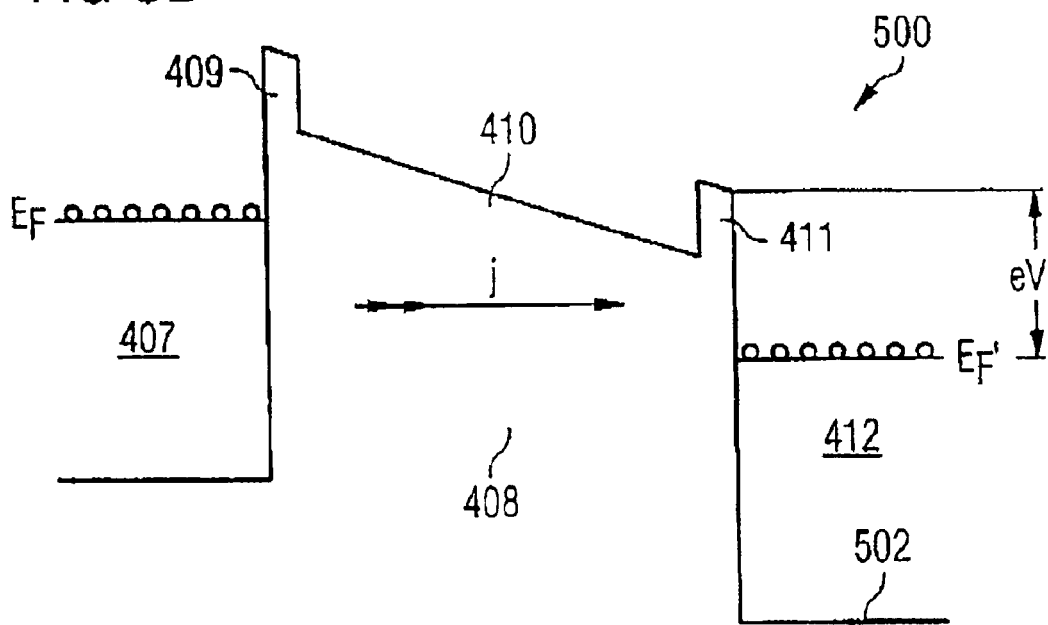
FIG. 5b shows a stepped potential profile with a lower potential barrier in the center in the strained state for the second electrical insulation layer of the floating gate field-effect transistor in accordance with FIG. 4.

FIG. 5b shows a stepped potential profile 500 with a lower potential barrier in the center in the strained state 502 for the second electrical insulation layer 408 of the floating gate field-effect transistor 400 in accordance with FIG. 4.

If a potential difference V is now applied between the floating gate region 407 and the gate electrode 412 of the floating gate field-effect transistor 400, a strained Fermi level $E_F'$ reduced by the energy difference eV results from the Fermi level $E_F$ of the gate electrode 412. As a result, charge carriers can tunnel in the form of an electric current j from the floating gate region 407 through the second electrical insulation layer 408 into the gate electrode 412.

In order to store charge carriers in the floating gate region 407, a potential difference V is applied between the floating gate region 407 and the gate electrode 412 of the floating gate field-effect transistor 400 in such a way that a strained Fermi level $E_F'$ reduced by the energy difference eV results from the Fermi level $E_F$ of the floating gate region 407. As a result, a current flow opposite to the electric current j is then produced, as a result of which charge carriers tunnel from the gate electrode 412 into the floating gate region 407.

On account of the structure of the layer sequence in the second electrical insulation layer 408, in particular on account of the small thickness d' of the lower layer 409 and the upper layer 411 of merely 1 nm in each case, charge carrier accumulation does not occur in the middle layer 410. Consequently, the tunneling of charge carriers through the layer sequence of the second electrical insulation layer 408 does not lead to a change in the electronic properties of the floating gate field-effect transistor 400.

FIG. 6 illustrates a diagrammatic cross section through a floating gate field-effect transistor 600 in accordance with a second exemplary embodiment of the invention.

The floating gate field-effect transistor 600 in accordance with the second exemplary embodiment is an alternative to the floating gate field-effect transistor 400 in accordance with the first exemplary embodiment. In contrast to the floating gate field-effect transistor 400 in accordance with the first exemplary embodiment, the two insulation layers which bound the floating gate region 407 toward the top and bottom are interchanged in the case of the floating gate field-effect transistor 600 in accordance with the second exemplary embodiment. In accordance with the second exemplary embodiment, the layer sequence comprising the lower layer 409, the middle layer 410 and the upper layer 411 is applied on the substrate surface 402 above the channel region 405 as first electrical insulation layer 601 below the floating gate region 407. In accordance with this exemplary embodiment, the lower layer 409 and the upper layer 411 each have silicon dioxide ($SiO_2$) having a thickness of 1 nm in each case. In accordance with this exemplary embodiment, the middle layer 410 has zirconium oxide ($ZrO_2$) having a thickness of 6 nm.

The positioning of the layer sequence comprising the lower layer 409, the middle layer 410 and the upper layer 411 between channel region 405 and floating gate region 407 has the advantage that the lower layer 409 can be produced by means of thermal oxidation of the substrate surface 402 and an ideal boundary face thus results between the channel region 405 and the lower layer 409.

In accordance with this exemplary embodiment, the upper layer 411 is deposited by means of atomic layer deposition (ALD). A total thickness of 8 nm results from this for the first electrical insulation layer 601 being 25% narrower than an equivalent homogeneous insulation layer made of silicon dioxide ($SiO_2$). In accordance with this exemplary embodiment, the second electrical insulation layer 602 between floating gate region 407 and gate electrode 412 has silicon dioxide ($SiO_2$) having a thickness of 10 nm.

In accordance with this exemplary embodiment, storage in or erasure of the floating gate region 407 is effected from the channel region 405 through the first electrical insulation layer 601. On account of the smaller thickness of the first electrical insulation layer 601 in comparison with a homogeneous insulation layer made of silicon dioxide ($SiO_2$) with the same insulation effect, the required programming or erasing voltage can be reduced to less than 8 V and the required writing time to less than 10 ns.

FIG. 7 shows a diagram 700 with current density/voltage characteristic curves 701, 702, 703 for three different types of electrical insulation layers for a floating gate field-effect transistor.

The diagram 700 illustrates the current density/voltage characteristic curves of three different floating gate field-effect transistors, used as memory cells, for an ambient temperature of 360 K. The three characteristic curves 701, 702, 703 are normalized in such a way that when a potential difference of 1 V is inadvertently applied externally to the floating gate, although the relevant insulation layer is energetically strained, the current density of the leakage current does not exceed a value of $10^{-16}$ A/cm$^2$ and a retention time of ten years is thus ensured in the floating gate. Consequently, the three characteristic curves 701, 702, 703 in the diagram 700 intersect at a voltage value of 1 V. This point of intersection is identified by the reference symbol 704 in the diagram 700.

The characteristic curve 701 results for a floating gate field-effect transistor in which the homogeneous insulation layer that is to be tunneled through for programming purposes has silicon dioxide ($SiO_2$) having a thickness of 5 nm. The characteristic curve 701 thus represents a homogeneous insulation layer with a linear potential profile. The characteristic curve 702 results for a floating gate field-effect transistor in which the insulation layer which is to be tunneled through for programming purposes has a layer sequence comprising a layer of silicon dioxide ($SiO_2$) having a thickness of 1 nm, a layer of silicon nitride ($Si_3N_4$) having a thickness of 3.8 nm and a layer of silicon dioxide ($SiO_2$) having a thickness of 1 nm. The characteristic curve 702 thus represents a layer sequence with a stepped potential profile—illustrated in FIG. 5b—with the lower potential barrier in the center and has an effectively active total thickness of about 3.9 nm owing to $d_{EOT}=\epsilon_2\epsilon_1 \cdot d$. The characteristic curve 703 results for a floating gate field-effect transistor in which the insulation layer which is to be tunneled through for programming purposes has a layer sequence comprising a layer of silicon dioxide ($SiO_2$) having a thickness of 1.2 nm, a layer of zirconium oxide ($ZrO_2$) having a thickness of 12 nm and a layer of silicon dioxide ($SiO_2$) having a thickness of 1.2 nm. The characteristic curve 703 thus likewise represents a layer sequence with a stepped potential profile—illustrated in FIG. 5b—with the lower potential barrier in the center and has an effectively active total thickness of about 4.3 nm owing to $d_{EOT}=\epsilon_2/\epsilon_1 \cdot d$.

The points 705 identify the maximum electric field that can be applied, at a level of 10 MV/cm. Larger electric fields would lead to leakage currents into the semiconductor substrate 401, as a result of which mechanical damage to the semiconductor substrate 401 can occur.

The diagram 700 shows that, with the same potential difference present, the electrically insulating layer sequence with the stepped potential profile with the lower potential barrier in the center enables a significantly larger current density in comparison with the insulation layer with a linear potential profile, even though the physical thickness of the electrically insulating layer sequence is greater than the thickness of the insulation layer with a linear potential profile. The consequence of this is that the required writing time can be correspondingly reduced in a floating gate field-effect transistor with an electrically insulating layer sequence according to the invention.

The following publications are cited in this document:

[1] Widmann, D., Mader H., Friedrich H.: "Technologie hochintegrierter Schaltungen", ["Technology of large scale integrated circuits"] Chapter 8.4, Springer Verlag, Berlin, IBSN 3-540-59357-8 (1996)

[2] DE 198 23 768 A1

[3] Nakazato K., Piotrowicz P. J. A., Hasko D. G., Ahmed H., Itoh K.: "PLED—Planar Localized Electron Devices" in IEEE Proc. IEDM97 Tech. Dig., pp. 179–182 (1997)

[4] Watanabe M., Fumayama T., Teraji T., Sakamaki N.: "$CaF_2/CdF_2$ Double-Barrier Resonant Tunneling Diode with High Room-Temperature Peak-to-Valley Ratio" in Jpn. J. Appl. Phys., Vol. 39, pp. L716-L719 (2000)

[5] WO 99/19913

List of reference symbols

| | |
|---|---|
| 100 | PLED memory cell in accordance with the prior art |
| 101 | Substrate |
| 102 | Source region |
| 103 | Drain region |
| 104 | Electrically insulating region |
| 105 | Charge storage region |
| 106 | Tunnel layer |
| 107 | Semiconducting region |
| 108 | Electrode |
| 109 | Lateral gate electrode |
| 200 | Resonant tunnel diode in accordance with the prior art |
| 201 | $n^+$-doped silicon substrate |
| 202 | First tunnel barrier |
| 203 | Potential well layer |
| 203a | First energy level |
| 203b | Second energy level |
| 204 | Second tunnel barrier |
| 205 | Electrically insulating layer |
| 206 | Electrode |
| 207 | Electrical current flow from the $n^+$-doped silicon substrate 201 through the potential well layer 203 right into the electrode 206 |
| 300 | Tunnel barrier in accordance with the prior art |
| 301 | Rectangular potential profile of the tunnel barrier |
| 302 | Ground state |
| 303 | Strained state |
| 304 | Stepped potential profile of the tunnel barrier with the highest potential barrier in the center |
| 305 | Ground state |
| 306 | Strained state |
| D | Thickness of the tunnel barrier |
| U | Potential level of the tunnel barrier |
| $E_F$ | Fermi level |
| d | Thickness of the middle layer |
| d' | Thickness of each outer layer |
| U' | High potential barrier of the middle layer |
| U" | Low potential barrier of the outer layers |
| eV | Applied external potential difference |
| $E_F$' | Strained Fermi level |
| j | Electric current |
| 307 | Charge carrier sink |
| 400 | Floating gate field-effect transistor in accordance with the first exemplary embodiment of the invention |
| 401 | Semiconductor substrate |
| 402 | Substrate surface |
| 403 | Source region |
| 404 | Drain region |
| 405 | Channel region |
| 406 | First electrical insulation layer |
| 407 | Floating gate region |
| 408 | Second electrical insulation layer |
| 409 | Lower layer |
| 410 | Middle layer |
| 411 | Upper layer |
| 412 | Gate electrode |
| 500 | Stepped potential profile of the second electrical insulation layer with lower potential barrier in the center |
| 501 | Ground state |
| 502 | Strained state |
| U* | High potential barrier of the outer layers |
| U** | Low potential barrier of the middle layer |
| 600 | Floating gate field-effect transistor in accordance with the second exemplary embodiment of the invention |
| 601 | First electrical insulation layer |
| 602 | Second electrical insulation layer |
| 700 | Diagram with current density/voltage characteristic curves |
| 701 | Characteristic curve for linear potential profile |
| 702 | Characteristic curve for stepped potential profile with higher potential barrier in the center |

-continued

| | List of reference symbols |
|---|---|
| 703 | Characteristic curve for stepped potential profile with lower potential barrier in the center |
| 704 | Point of intersection of the three characteristic curves |
| 705 | Point identifying the maximum electric field that can be applied |

What is claimed is:

1. A floating gate field-effect transistor comprising:

a source region, a drain region and a channel region;

a first electrical insulation layer arranged above the channel region;

a floating gate region arranged above the first electrical insulation layer;

a second electrical insulation layer arranged above the floating gate region;

a gate region arranged above the second electrical insulation layer, wherein the first electrical insulation layer or the second electrical insulation layer having an electrically insulating layer sequence comprising three layers as a triple tunnel barrier adapted such that, for storing charge carriers in the floating gate region or for removing charge carriers from the floating gate region, charge carriers tunnel through the triple tunnel barrier, the electrically insulating layer sequence having a lower layer made of a material having a first relative permittivity, a middle layer made of a material having a second relative permittivity and an upper layer made of a material having a third relative permittivity; and the second relative permittivity being greater than the first relative permittivity and greater than the third relative permittivity;

the electrically insulating layer sequence being provided in such a way that a stepped potential profile forms in the funnel barrier, the middle layer having a lower potential barrier than the lower layer and than the upper layer.

2. The floating gate field-effect transistor as claimed in claim 1, which is set up in such a way that charge carrier accumulation does not take place when an electric field is present in the electrically insulating layer sequence.

3. The floating gate field-effect transistor as claimed in claim 1 or 2, in which the lower layer and the upper layer have a potential barrier that is between 0.5 eV and 1.5 eV higher than that of the middle layer.

4. The floating gate field-effect transistor as claimed in claim 1, in which the first relative permittivity and the third relative permittivity each have a value in the range between 1 and 10, and in which the second relative permittivity has a value in the range between 10 and 25.

5. The floating gate field-effect transistor as claimed in claim 1, in which, in the electrically insulating layer sequence, the lower layer and the upper layer are produced from the same material.

6. The floating gate field-effect transistor as claimed in claim 1, in which the lower layer and the upper layer of the electrically insulating layer sequence each have a thickness in the range from 0.5 nm to 2 nm, and in which the middle layer of the electrically insulating layer sequence has a thickness in the range from 5 nm to 10 nm.

7. The floating gate field-effect transistor as claimed in claim 1, in which the lower layer and the upper layer of the electrically insulating layer sequence each have silicon diocide and a thickness of 1 nm, and in which the middle layer of the electrically insulating layer sequence has zirconium oxide and a thickness of 6 nm.

* * * * *

UNITED STATES PATENT AND TRADEMARK OFFICE
CERTIFICATE OF CORRECTION

PATENT NO. : 6,914,292 B2
APPLICATION NO. : 10/302615
DATED : July 5, 2005
INVENTOR(S) : Michael Specht et al.

It is certified that error appears in the above-identified patent and that said Letters Patent is hereby corrected as shown below:

On the front page, in field (30) Foreign Application Priority Data, the number "101 58 019" should be changed to -- 101 58 019.3-33 --.

Signed and Sealed this

Twenty-ninth Day of August, 2006

JON W. DUDAS
*Director of the United States Patent and Trademark Office*